(12) United States Patent
Williams

(10) Patent No.: US 9,320,131 B2
(45) Date of Patent: Apr. 19, 2016

(54) POWER SUPPLY DEVICE AND COMPONENTS THEREOF

(75) Inventor: Donald Victor Williams, Woodford (AU)

(73) Assignee: Intervention Technology Pty Ltd, Victoria, NSW (AU)

( * ) Notice: Subject to any disclaimer, the term of this patent is extended or adjusted under 35 U.S.C. 154(b) by 534 days.

(21) Appl. No.: 14/345,253

(22) PCT Filed: Sep. 16, 2011

(86) PCT No.: PCT/AU2011/001200
§ 371 (c)(1),
(2), (4) Date: Mar. 17, 2014

(87) PCT Pub. No.: WO2012/034190
PCT Pub. Date: Mar. 22, 2012

(65) Prior Publication Data
US 2014/0369006 A1 Dec. 18, 2014

(30) Foreign Application Priority Data
Sep. 17, 2010 (AU) ................ 2010904218

(51) Int. Cl.
| H05K 7/20 | (2006.01) |
| H05K 1/02 | (2006.01) |
| H05K 3/30 | (2006.01) |
| H05K 13/08 | (2006.01) |
| H05K 3/00 | (2006.01) |

(52) U.S. Cl.
CPC .............. *H05K 1/0203* (2013.01); *H05K 3/30* (2013.01); *H05K 7/209* (2013.01); *H05K 7/2089* (2013.01); *H05K 7/20518* (2013.01); *H05K 13/08* (2013.01); H05K 3/0061 (2013.01); H05K 2203/163 (2013.01); Y10T 29/49004 (2015.01); Y10T 29/4913 (2015.01)

(58) Field of Classification Search
CPC ..... H05K 7/0203; H05K 7/2089; H05K 3/30; H05K 3/08; H01L 23/38; H01L 35/32; H01L 35/00
See application file for complete search history.

(56) References Cited

U.S. PATENT DOCUMENTS

| 4,748,355 | A  * | 5/1988 | Anderson | H02K 5/225 310/71 |
| 6,459,586 | B1 * | 10/2002 | Miller | H01F 17/043 174/252 |
| 6,556,455 | B2 * | 4/2003 | Dibene, II | G06F 1/18 257/696 |
| 6,771,507 | B1 * | 8/2004 | Belady | H01L 23/4006 165/185 |
| 6,819,562 | B2 * | 11/2004 | Boudreaux | H01L 23/4006 165/185 |
| 6,970,367 | B2 * | 11/2005 | Takeshima | H02M 7/003 363/147 |
| 6,982,876 | B1 * | 1/2006 | Young | H05K 1/0203 165/185 |
| 7,289,328 | B2 * | 10/2007 | Belady | H05K 1/141 257/707 |
| 7,327,569 | B2 * | 2/2008 | Belady | G06F 1/189 165/104.33 |
| 7,688,597 | B2 * | 3/2010 | Bothe | H01F 27/2804 361/760 |
| 8,351,216 | B2 * | 1/2013 | Fotherby | H02M 7/003 174/250 |
| 8,427,833 | B2 * | 4/2013 | Barowski | H01L 23/481 257/691 |
| 2006/0187646 | A1* | 8/2006 | Belson | H05K 1/141 361/719 |

* cited by examiner

*Primary Examiner* — Gregory Thompson
(74) *Attorney, Agent, or Firm* — Moore Patents; David Dreyfuss

(57) ABSTRACT

A power supply device includes a capacitance partition, a control partition, a power switching partition, a thermal conduction partition, and a magnetic partition. The thermal conduction partition includes electrical connections to connect other partitions. The thermal conduction partition provides for magnetic shielding of the magnetic partition and thermal dissipation in a substantially orthogonal direction to the electrical connections. The layering arrangement allows automated production and/or testing.

20 Claims, 10 Drawing Sheets

POWER SUPPLY DEVICE AND COMPONENTS THEREOF

TECHNICAL FIELD

The present invention generally relates to power supply units or devices, and components thereof, for providing power to electronic devices. More particularly, various alternate aspects generally relate to a power supply unit or device provided with partitions or a layered structure, components thereof, for example a thermal conduction partition, a method of manufacturing or testing, and/or a transformer.

BACKGROUND

Presently known power supplies, for example Intel™ ATX specification compliant small power supplies, and other miniaturisation designs exemplified by the many varieties of DC-DC or AC-DC "Brick" Power Supply Units (PSU), have significant disadvantages. Known PSUs do not provide overt spatial partitioning of a switching partition, for example, from control, magnetic or capacitive electronics. Energy storage components are primarily larger capacitors, such as electrolytic capacitors which are required to be kept cool, and magnetic components are transformer or inductive devices which are more efficiently run at elevated temperature being primarily ferrite based. Together these two component types consume the majority of spatial volume in the total volume of a contemporary PSU.

While PSU "Hold Time" energy is provided by bulky electrolytic capacitors, the use of higher switching frequencies allows smaller ceramic capacitors and also smaller ferrite components. However, such higher frequencies also incur deleterious coupling between components, higher switching losses and greater losses in the ferrite components. Also higher frequency switching in known PSUs may violate regulatory Electro Magnetic Compatibility standards (EMC). Such switching losses are increased by the reduction of slew rates to enhance EMC internal to the PSU. The waveform switching edges and "ringing" are a result of circulating earth currents, and coupling of current loops where deleterious energy pickup is proportional to the length of return earth paths and current loop areas of the control electronics.

Known PSU devices employ components which are essentially confined to one plane, partition, layer or level of physical construction, within which both magnetic and electrical or charge storage operations or functions occur. In known PSU devices, to avoid crosstalk and electromagnetic interference between components, spatial separation within this plane between components is generally relied upon, thus leading to a relatively large area and consequently large sized devices.

By way of example, U.S. Pat. No. 6,459,586 describes a PSU having a single PCB layer containing both power switches and power control circuitry attached to a heat-sink. U.S. Pat. No. 7,515,412 describes a PSU in which capacitors and magnetic components are intermixed for circuit design convenience.

There is a need for a power supply device or unit, components thereof and/or a method of manufacturing or testing which addresses or at least ameliorates one or more problems inherent in the prior art.

The reference in this specification to any prior publication (or information derived from the prior publication), or to any matter which is known, is not, and should not be taken as an acknowledgment or admission or any form of suggestion that the prior publication (or information derived from the prior publication) or known matter forms part of the common general knowledge in the field of endeavour to which this specification relates.

BRIEF SUMMARY

In one broad form there is provided a power supply device provided with partitioning or layering of component parts. A thermal conduction partition or layer is provided to isolate, separate and/or shield at least one of a capacitance, control and switching partition or layer from a magnetic partition or layer. Moreover, preferably the thermal conduction partition also provides a thermal conduction pathway. The thermal conduction pathway to heat-sinks can be remote to the area of electrical connectivity. The partitioning or layering provides a stacked structure allowing reduced conductor lengths and current loop areas, leading to a reduced overall physical volume for the power supply device. In another broad form there is provided a novel thermal conduction partition functioning concurrently as an electrical connector between partitions.

In one aspect, there is provided a power supply device, including: a capacitance partition; a power switching partition; a thermal conduction partition; a magnetic partition; and, wherein the thermal conduction partition includes electrical connections to connect at least the power switching partition and the magnetic partition. Preferably, the thermal conduction partition has a thermal interface to the power switching partition.

Preferably, the thermal conduction partition provides for thermal dissipation in a substantially orthogonal direction to the electrical connections. Also preferably, the power supply device includes a control partition spatially isolated in effect from the switching partition and the magnetic partition. In one form the thermal interface is substantially planar. In another form the thermal interface is a compressible or profiled section allowing for different component heights. In another form the thermal conduction partition is adjacent to and physically contacts the power switching partition. This can also be used to provide for strategic or selective shielding on the power switching partition.

In a particular example, at least some of the electrical connections of the thermal conduction partition connect to the control partition and the power switching partition. In a further particular example, the electrical connections are integrated with or moulded as part of the thermal conduction partition forming an integrated thermo-electric connector.

According to non-limiting example forms: the electrical connections are electrically conductive through pins; the thermal conduction partition is positioned between the capacitance partition and the magnetic partition; and/or the thermal conduction partition includes a substantially planar metallic section. In a particular example aspect, the thermal conduction partition magnetically isolates the magnetic partition from other partitions more particularly the control partition.

According to further non-limiting example forms: the thermal conduction partition is at least partially metallic; the thermal conduction partition is formed of moulded plastic containing ferrite particulates; the thermal conduction partition includes ferrous material; and/or the thermal conduction partition includes an insulating layer that is an electrically insulating layer, a flexible insulating layer, a thermally conductive insulating layer, or a combination of such providing an electrically insulating and thermally conductive layer that may also be flexible.

Preferably, the magnetic partition includes at least one magnetic component, transformer or inductor. Also preferably, the capacitance partition includes at least one electrical storage capacitor.

In yet further example aspects: connections are provided in three dimensions between functional circuit nodes thereby reducing the area and consequently the effect of current loops on power switch control; and/or connections are provided in three dimensions allowing a reduced size for the power supply device.

In a particular example form, at least some of the electrical connections assist to provide mechanical stability at least between the capacitance partition, the thermal conduction partition and the magnetic partition as a layered structure.

In a further particular example form, the layered structure is ordered structurally as the capacitance partition, the power switching partition, the thermal conduction partition, and the magnetic partition. In still a further particular example form, the layered structure is ordered structurally as the capacitance partition, adjacent the control partition, the control partition adjacent the power switching partition, the power switching partition adjacent the thermal conduction partition, and the thermal conduction partition adjacent the magnetic partition.

In yet further example aspects: a thermally dissipative encasement housing the layered structure is provided; heat is transferred from an edge region of the thermal conduction partition to the thermally dissipative encasement; the thermally dissipative encasement is at least partially metallic; the thermally dissipative encasement provides a thermal connection to an external structure; the thermally dissipative encasement allows a higher pressure air passage throughout the internal containment for the dissipation of heat; and/or the thermally dissipative encasement provides for an infill of a thermally conductive liquid thereby further reducing a temperature gradient to the thermally conductive encasement.

In still yet further example aspects: the control partition is isolated from the encasement by a shaped insulation strip; and/or the shaped insulation strip presses at least one power switch of the power switch partition into a compressible thermally conductive gasket attached to or formed as part of the thermal conduction partition.

In another aspect, there is provided a method of manufacturing a power supply device which includes a separate assessment of a control partition, a switching partition, a capacitance partition, a thermal conduction partition, and a magnetic partition, wherein the thermal conduction partition includes electrical connections which may be replaced by test probes simulating connection with functional partitions such that when the test probes are replaced by the thermal partition or otherwise termed thermo-electric connector the consequently combined and connected partitions constitute a functional PSU device.

For the example purpose of ascertaining the highest confidence in reliability, each separate layer can be tested separately according to the principles of accelerated ageing with test conditions suited to the device type. For example, the glues used for ferrite construction should be tested at the operational temperatures of the ferrite which are of the order of about 150° C., while the highest appropriate temperature excursion for the electrolytic capacitance components is expected to be of the order of about 100° C. Similarly, the accelerated ageing of the switching elements is preferably tested at elevated temperatures in comparison to any ceramic capacitors and the control circuitry.

In another aspect, there is provided a method of manufacturing a power supply device which includes a capacitance partition, a thermal conduction partition, a magnetic partition, and wherein the thermal conduction partition includes electrical connections between at least the capacitance partition and the magnetic partition, the method including the steps of: individually testing at least one of the capacitance partition and the magnetic partition; and, positioning, using automated means, the capacitance partition, a control partition, a power switching partition, the thermal conduction partition and the magnetic partition in a layered structure.

Optionally, further including testing successive connected partitions as each of the partitions is combined. Preferably, at least some of the electrical connections between the partitions are effected by the positioning step.

In an alternate broad form, there is provided a novel transformer. Winding coils used in the transformer are thinner than compressible coil separators placed between the winding coils. This allows the number of winding coils to be increased or decreased as required. Preferably, the compressible coil separators also provide a thermal conduction pathway. Advantageously, this allows the complete transformer to be constructed by auto-placement or auto-insertion robotic technology.

In another example form, the thermally conductive connector may be integrated with the magnetic structure, it being recognized that ferrite, in bulk, provides thermal conduction and low electrical conductivity, and has during construction embedded windings separated with thermal relief separator leaflets placed with spatially organized through pins. This arrangement, in total effect, provides a distributed magnetic structure(s) with lower EMC consequence and is dependent on a layering or partitioned structure for assembly of the multiple magnetic parts being pressed together to provide magnetic circuitry for interface with the switching, control and capacitance partitions.

Various embodiments are advantageous in providing or facilitating a self monitoring function of the power supply device and/or components thereof, for example by providing more effective noise reduction and allowing measurement of internal parameters allowing prognosis calculation of serviceability.

Various embodiments also provide other advantages including, for example, lower noise, faster testing in manufacture, faster assembly, self diagnosis and/or providing serviceability information to a network when deployed for use.

BRIEF DESCRIPTION OF FIGURES

Example embodiments should become apparent from the following description, which is given by way of example only, of at least one preferred but non-limiting embodiment, described in connection with the accompanying figures.

PREFERRED EMBODIMENTS

Figure 1:
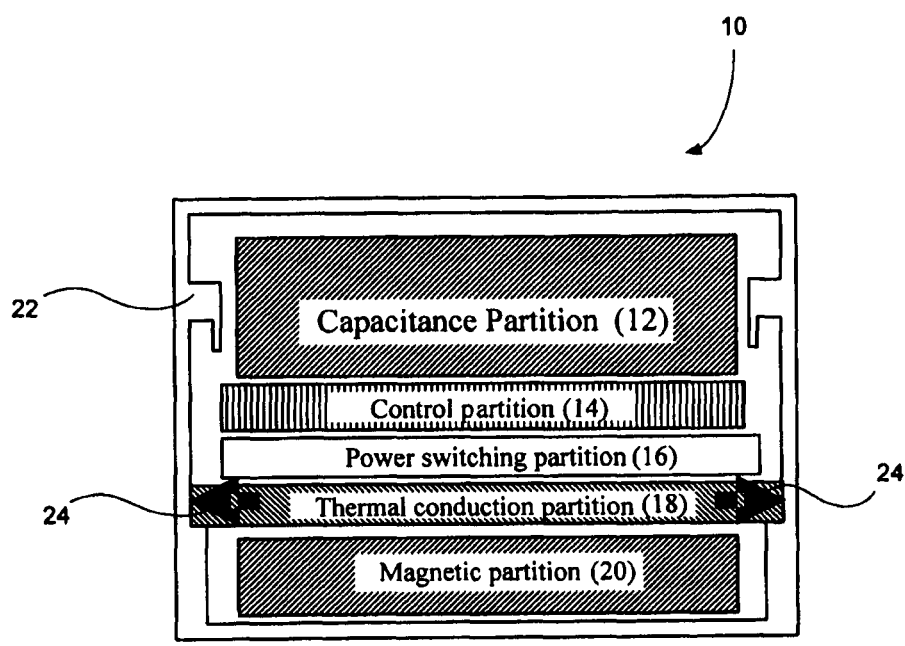
FIG. 1 illustrates a cross-sectional conceptual view of an example power supply device.

The following modes, given by way of example only, are described in order to provide a more precise understanding of the subject matter of a preferred embodiment or embodiments.

In the figures, incorporated to illustrate features of example embodiments, like reference numerals are used to identify like parts throughout the figures.

Power Supply Device

A preferred embodiment of the present invention is now described. This embodiment describes the use of an example electrical conversion device, where an input power of voltage and current is converted into one or more outputs of voltage and current but of less total output power due to conversion loss. The physical structure described herein is inherently suitable for a variety of alternate embodiments.

The topology used is optimised for minimum size and power density with extended Power Fail Early Warning (PFEW). A general description of the electronic topology is of a Constant Current Mode PFC and Asymmetric Half Bridge with synchronous rectification with synchronised buck "step down" output DC-DC stages. It should be noted that an AC out can also be provided.

Referring to FIGS. 1 to 10 in general, there is provided a power supply device 10 including a capacitance partition 12, a power switching partition 16, a thermal conduction partition 18 and a magnetic partition 20. A Partition is herein taken to mean a layer or a separate section wherein the components provide a similar function and consequently are predominantly or substantially of a similar type of electronic component. The thermal conduction partition 18 preferably has a thermal interface to the power switching partition, for example a substantially or generally two dimensional connecting section or segment, or where substantially flat surfaces of the respective partitions abut or are positioned adjacent each other. Although not necessarily strictly planar or two dimensional, the general extent of the interface, relative to the three dimensional device, can be substantially or generally planar or two dimensional. In one example form the thermal interface is thus substantially planar or otherwise "continuous" to facilitate placement and movement across automatic test equipment used in manufacture. In another example form the thermal interface is a compressible or profiled section allowing for different component heights on the power switching partition. The thermal interface between the partitions need not extend for the whole or complete length or width of a partition, but can be for a partial section or segment of a partition, whichever method suites automatic test fixtures or provides a reduced noise advantage.

Preferably, thermal conduction partition 18 also includes electrical connections, such as through pins 36 to connect at least the capacitance partition 12, a control partition 14, the switching partition 16 and/or the magnetic partition 20. The thermal conduction partition 18 provides for thermal dissipation in a substantially orthogonal direction to the electrical connections 36. The power supply device also includes control partition 14. At least some of the electrical connections 36 of the thermal conduction partition 18 connect to the control partition 14 and the power switching partition 16. The thermal conduction partition 18 magnetically isolates the magnetic partition 20 from other partitions.

The thermal conduction partition 18 is at least partially metallic, and can be formed of, at least partially, moulded plastic containing ferrite particulates. The thermal conduction partition 18 could alternatively or additionally include ferrous material. Also additionally, the thermal conduction partition 18 can include an insulating layer or section adjacent a metallic layer or section.

The magnetic partition 20 includes at least one magnetic component, transformer or inductor. The capacitance partition 12 includes at least one electrical storage component or capacitor. Connections are provided in three dimensions between functional circuit nodes thereby reducing the effect of current loops on power switches in power switching partition 16. This allows a reduced size for the power supply device 10.

Additionally, at least some of the electrical connections 36 assist to provide mechanical stability at least between the capacitance partition 12, the thermal conduction partition 18 and the magnetic partition 20 as a layered structure. The layered structure is ordered as the capacitance partition 12 adjacent the control partition 14, the control partition 14 adjacent the power switching partition 16, the power switching partition 16 adjacent the thermal conduction partition 18, and the thermal conduction partition 18 adjacent the magnetic partition 20.

A thermally dissipative encasement or housing 22 for the layered structure is provided. Heat is transferred from an edge region of the thermal conduction partition 16 to the thermally dissipative encasement 22. The control partition 14 is isolated from the encasement 22 by a shaped insulation strip 30 which presses at least one power switch of the power switch partition 16 into a compressible thermally conductive gasket attached to or formed as part of the thermal conduction partition 18.

Referring more specifically to FIG. 1, there is illustrated the stacking order of partitions (a capacitance partition 12, a control partition 14, a power switching partition 16, a thermal conduction partition 18 and a magnetic partition 20) shown in a diagrammatic fashion. Thermally dissipative encasement 22, for example made of metal, provides electro-magnetic conducted and radiated noise amelioration, and also supports internal insulation placement, such as required for compliance with regulatory requirements of creepage and clearance. Encasement 22 also provides a means of establishing uniform internal thermal connection and minimisation of hot spots, and for heat exchange with various external heat exchanging surfaces, such as the internal walls of an overall PC or electronic equipment case. Also, schematically illustrated is the general direction 24 of thermal dissipation from thermal conduction partition 18 to encasement 22. This thermal conduction pathway is generally orthogonal to a cross-sectional plane or surface of thermal conduction partition 18, or generally orthogonal interface planes between partitions, or generally orthogonal to through pins as later described.

Figure 2:
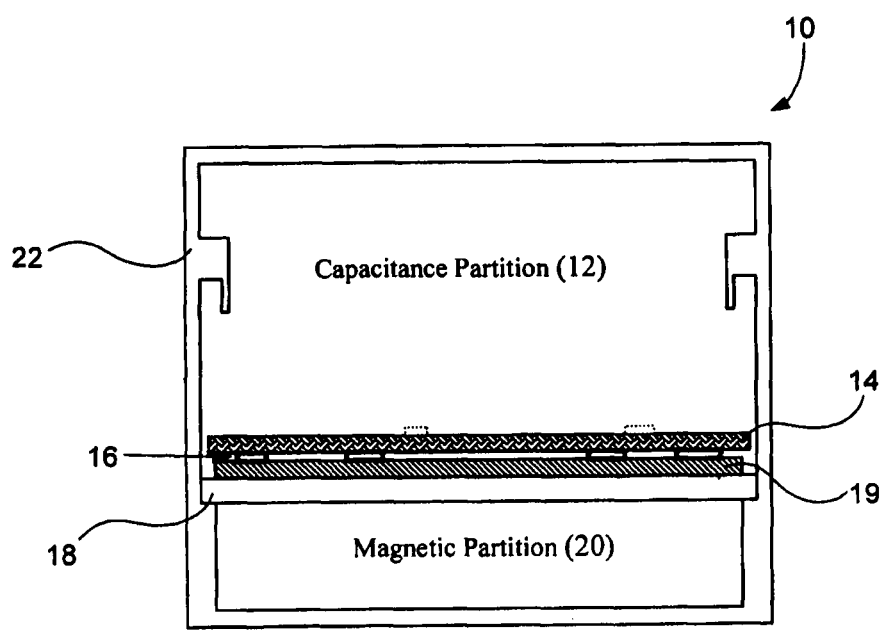
FIG. 2 illustrates a cross-sectional view of an example power supply device.

FIG. 2 illustrates an exemplification of the diagrammatic partitioning of FIG. 1. Preferably, close impressing or abutment of power switching partition 16 (i.e. a power semiconductor layer), having for example power switches 17, into or against flexible layer 19, for example silicone sheet, provided adjacent or as part of thermal conduction partition 18. This is facilitated by contemporary power switches which have thermal dissipation capability from the top of the casing which is pressed into flexible layer 19 which provides an electrically insulative and thermally conductive layer.

FIG. 2 also illustrates the layering arrangement which allows sequential and automated or semi-automated production and/or testing. The power supply device 10 can be tested on a "layer after layer" approach, such that tests can be performed, for example of the control systems, before the application of high voltage at an assembly stage, which minimizes rework. The encasement 22, for example a metallic extruded case, can also provide advantages for fan-less applications where the generally rectangular closed extrusion section provides a de-facto mould for pouring and solidification or "setting" of thermally conductive gel or liquid plastics such as epoxies, silicones or polyurethanes or other materials used as thermally conductive filler.

Figure 3:
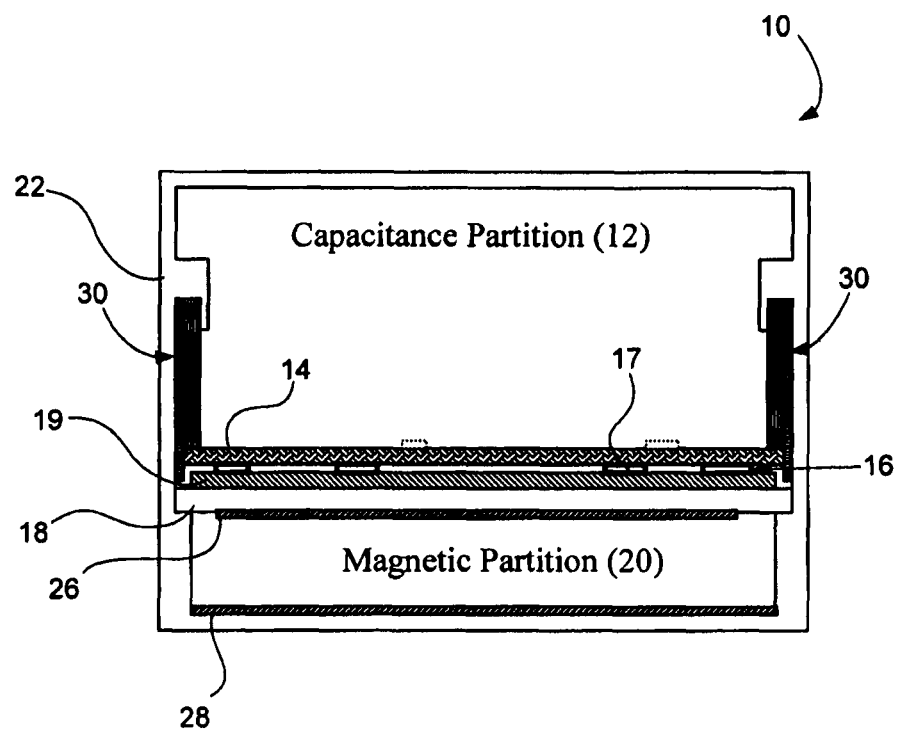
FIG. 3 illustrates a cross-sectional view of a further example power supply device with insulative components.

FIG. 3 illustrates insulative pressure strips 30, providing insulation serving three main purposes. Firstly, an insulation function to comply with regulatory requirements of creepage and clearance to an earthed chassis. Secondly, an even distribution of pressure across a PCB containing control and power switching to ensure constant thermal resistance contact between the flexible PCB power semiconductor layer and the flexible layer 19 providing uniform thermal contact with a heat-sink while also providing electrical insulation. Thirdly, to replace the need for screws, nuts or bolts to hold the overall structure together and thus allow low cost of assembly. Insulation layers 26, 28 can also be provided, which may be polyimide insulator layers to assist with clamping or fixing the magnetic partition 20.

Figure 4:
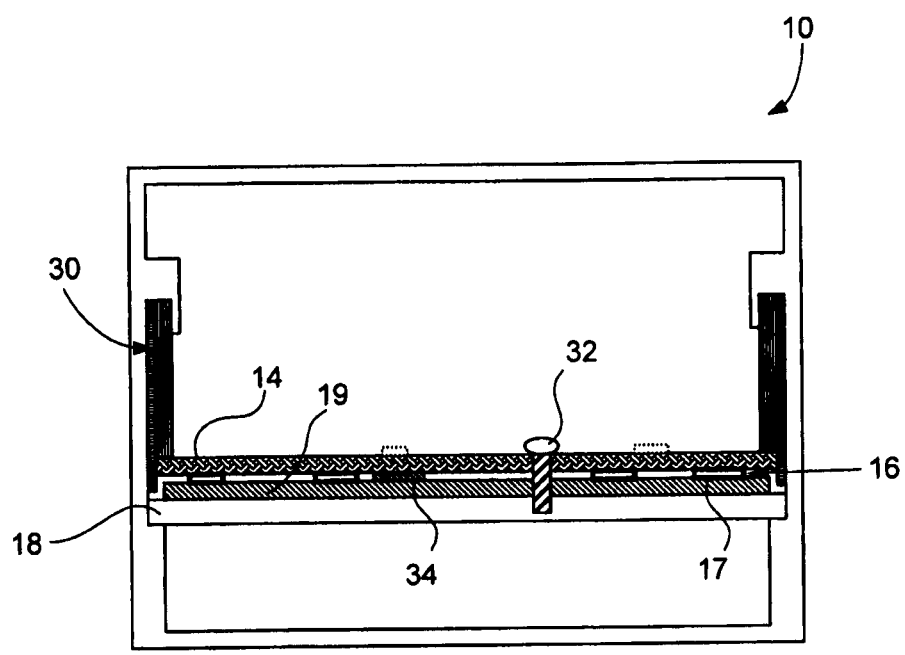
FIG. 4 illustrates a cross-sectional view of a further example power supply device with a fixing component.

FIG. 4 is a diagrammatic representation of the use of flexible layer 19, for example silicone sheeting, to provide thermal pathways to surrounding heat sinking via a base platen. The thermal pathways are also extended to higher energy electronic components on electronic control partition 14, such as MOSFET gate drivers and other PWM controllers, as illustrated by section 34 where pads of thermally conductive and compressed sheeting are pressed against solder filled PCB holes. Such resilience provided by the thermally conductive silicone sheeting 19 allows small differences in fixture heights and alignment to be compensated for by the flexible nature of silicone under pressure. This assists to establish good thermal contact with the thermal heat sinking of the silicone when pressed into the silicone layers by the insulative pressure strips. The separation between the high switching slew rate of the power electronics on the power switching partition 16 and the earthing or neutral structure minimises parasitic capacitances toward ground potential which determine common mode disturbance of the output rails and other manifestations of conducted and radiated noise. A single screw 32, such as an M3 screw, is used to fix the controller PCB of the control partition 14 to the thermal conduction partition 18, which can be provided as a metal base platen which also serves as a chassis connection for the fixed electrical "earth" regulation requirements.

Figure 5:
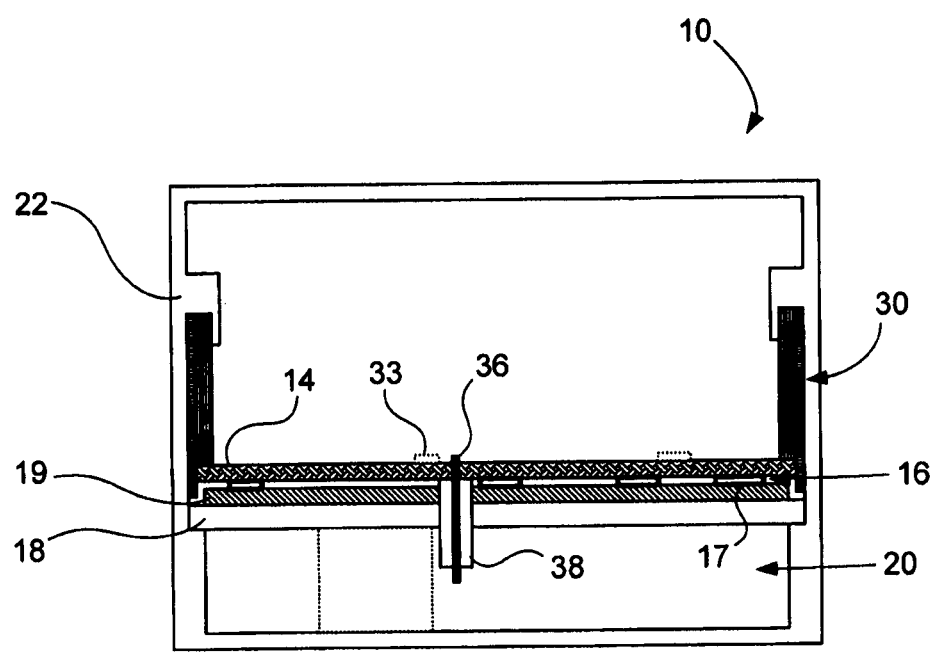
FIG. 5 illustrates a cross-sectional view of a further example power supply device with a through pin.

FIG. 5 illustrates the placement of a conducting "through pin" 36 (e.g. a metallic pin) which connects two or more partitions or layers, preferably making the shortest distance connection between high current power switches (on power switching partition 16) and components of the magnetic partition 20, such as magnetic component windings. A single through pin 36 is illustrated for clarity, although in practice a plurality of through pins would typically be used to connect different components in different partitions. Through pin(s) 36 also connects to sense nodes and other low current nodes on the control partition 14 (i.e. controller PCB layer). Insulation 38 is provided about at least part of through pin 36 and has thickness and insulation properties in compliance with regulatory requirements. During production testing the planar arrangement of thermal conduction partition 18 with through pins 36 facilitates attachment to connector receptacles on robotic test beds, thereby allowing the test bed to replace the magnetic partition 20 (i.e. magnetic layer) for the purpose of testing. Sense amplifier 33 can be provided on control partition 14 as a sense node to associate with through pin 36.

Figure 6:
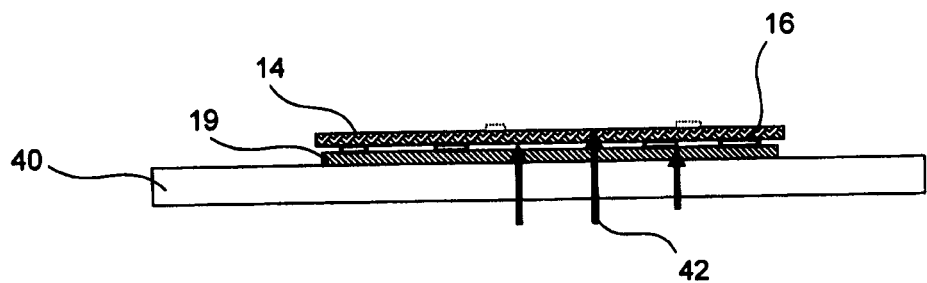
FIG. 6 illustrates a cross-sectional view of an example testing arrangement.

FIG. 6 illustrates selected partitions or layers passing across or connecting to a robotic test bed 40, where the through pins 36 have been replaced by the probes 42 of the robotic testing fixture. Robotic test bed 40 can be a test platen and probes 42 can be spring loaded. Test probe pins 42 can connect to a magnetic partition fixed into the test fixture for accessing the control and power switching partitions. In robotic assembly, the PCB containing the power electronics partition and the control electronics partition can be passed over a computer controlled test platen so that apertures can be accessed to the power and control partitions by probes 42.

This layering arrangement or structure allows a method of manufacturing of the power supply device to be provided. The method including the steps of individually testing at least one of the partitions, and then positioning, using automated means, the partitions in a layered structure.

Figure 7:
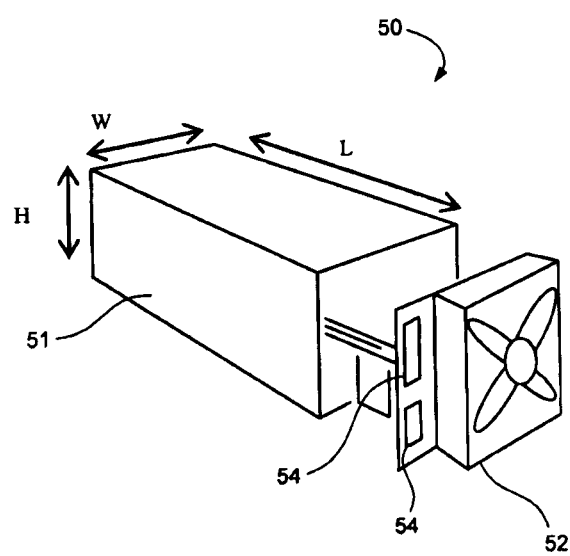
FIG. 7 illustrates a perspective view of the exterior of an example power supply device.

FIG. 7 illustrates a final assembly 50 where the capacitance, control, power switching, thermal conduction and magnetic partitions are all assembled in a stacked layered structure and inserted into extruded metal shell 51. Subsequent to this assembly pressure strips 30 are inserted and the mains attached providing a finished power supply device. The presence of optional fan 52 which forces air through a passage, for example a cylindrical tube, effects greater heat exchange because of the higher gas pressure transiting through the device 50. This extra cooling provided by cooling fan 52 facilitates heat exchange with other objects or components which are heat dissipative. For example, such as being used in conjunction with or replacing heat-sinks mounted on a CPU of a personal computer motherboard. Connectors 54 to external motherboards or other electronics are provided. Example physical dimensions of device 50 that can be achieved are about 52 mm width (W), 42 mm height (H) and 100 mm length (L). Prior to insertion of the pressure strips 30 the thermal platen complete with attached fan 52 can be inserted into one end of extruded case or housing 51. The fan 52 is optional, and in a fan-less embodiment the case 51 can be filled with a thermally conductive polymer, gel or liquid.

Figure 8:
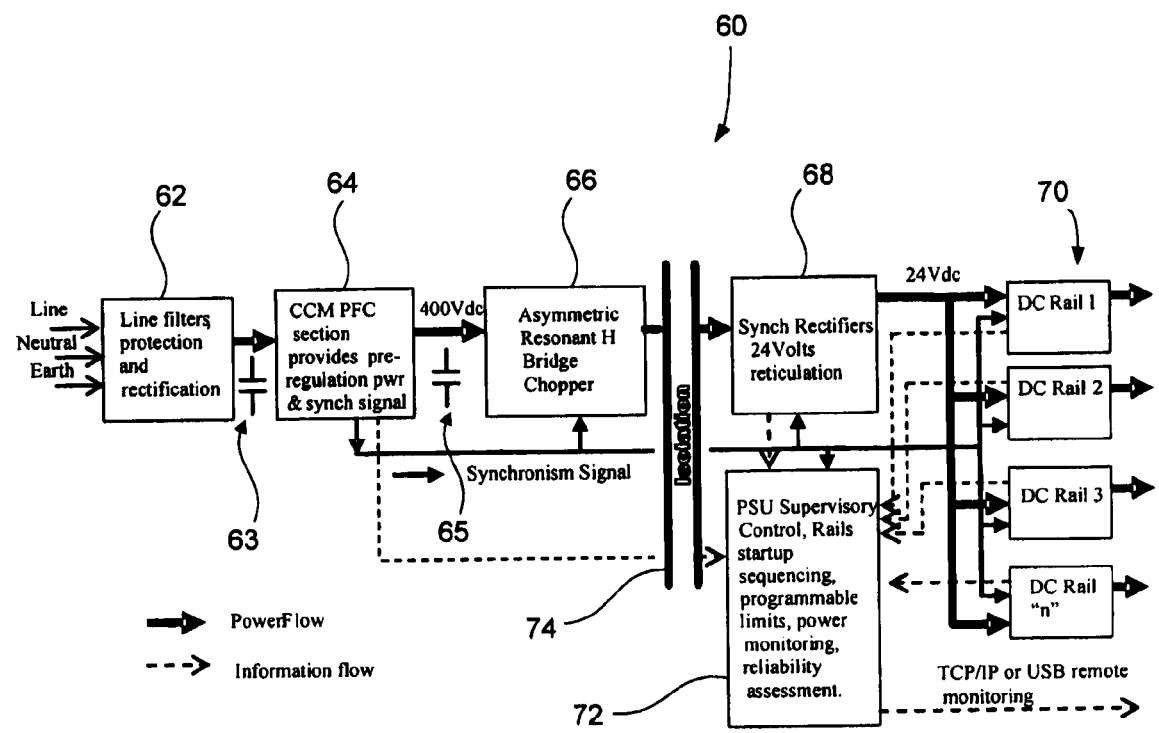
FIG. 8 illustrates an example control block diagram showing the connectivity of internal sensor and data pathways as well as the connectivity to external networking.

FIG. 8 illustrates an example control block diagram 60 showing electronic functional details. An important feature of the design of the electronics is that of seeking miniaturization which exploits the physical design and construction of the device. The physical construction provides an environment for low noise electrical control and measurement in addition to thermal advantages. A further means to achieve low noise measurement and control is to arrange synchronism of switching from power input to power output, and for example by providing minimal areas presented by control circuit conductive loops and power transmission feedback loops as discussed herein.

A consequence of volumetric compression of the functional elements of any high power electronic device is to place high magnetic and electrical field flux elements in close proximity with lower voltage control and sense nodes, and consequently cause such undesirable effects as "crosstalk" and "parasitic capacitance effects", where signals are coupled between such circuits. Such circuits deleteriously effected are high impedance error amplifier circuits and over-current or over-voltage circuits where errors may be catastrophic and indeed cause perturbations leading to emission of noise or high voltages to sensitive dependent electrical circuits. The higher the power density of the device the greater the coupling strength of these stray magnetic and electrical fields with sensitive circuitry. Thus, minimising or reducing any loop area coupling and proximity assists to minimize or reduce noise.

In simplistic terms, a circuit requiring a layout of "n" components, each of area "A", in a single plane occupies "n×A" in total area. Were these same "n" components able to be arranged in a three dimensional "stack" or layered structure, one above the other, the required surface area may approach the area of a single component "A". This is an advantageous arrangement if the separation between the layers or partitions allows reduction of electrical connectivity lengths. The extent to which this is possible to a practical degree is determined by the ability of the circuitry to have coincident positions within the circuitry on each plane, which is achieved in the present embodiments by the use of through pins (for example though pins 36, 94).

Further practicality of this spatial arrangement can be achieved by providing a level of isolation 74 between partitions or layers, the isolation interspersed between stray magnetic and electric fields, such that the physical separation of partitions or layers can be further reduced. The partitions or layers are able to be in relatively close proximity due to the placement of a thermal relief layer between the switching devices of the power switching partition or layer and the magnetic devices of the magnetic partition or layer, so providing effective isolation between electric and magnetic fields and control voltages. Additionally, the space occupied by the body of the switching devices can provide further isolation between high current devices and their control means.

The synchronism effected throughout the power supply device allows sampling for analogue to digital conversion to be also synchronous with switching epochs such that "quiet" periods can be predicted for sampling, and further, such deterministic sampling periods will exhibit constant noise effects allowing changes over longer periods to be accurate. Further signal integrity is achieved by "signal averaging" so as to achieve significant cancellation of any stochastic noise.

There are a number of well known power supply unit (PSU) "topologies" that could be chosen, and this example is of a type referred to in the literature as "resonant", and such types manifest the lowest EMC and internal ringing so providing lower noise in the sampling process. The topology used in an example preferred embodiment is a constant current Power Factor Correction (PFC), followed by an asymmetric resonant half bridge with synchronous secondary rectification and Buck step down to DC rails output.

Referring FIG. 8, in a particular example there are three diagnostic parameters which are measured for the purpose of determining the PSU serviceability, which can be used to obtain serviceability information, that in an example aspect can be transmitted via a network. These are the power conversion efficiency, power conversion noise and temperature.

The temperature is read from an internal sensor in conventional fashion, and compared with setup limits and can be adjusted via a network connection in accordance with expectations of the installation.

For an efficiency measurement, it is noted that accurate measurement can be made of the output current on each rail in association with the corresponding voltage on each output rail and consequently the output power is known.

It is also noted that the input power is known accurately, this being the correspondence of the duty cycle of the PFC switching device and the ripple voltage on the main PFC output storage capacitor which varies in magnitude in accordance with the output load current within the limited control time constant of the power factor correction function.

The noise of the system is directly measureable from the jitter of the MOSFET gate duty cycle and the noise on the output 24Vdc rails reflecting the voltage on the primary. This is better considered when the variability of the 24Vdc ripple is not consistent with the control time constant of the PFC controller setting which is known by design. Further noise measurement for the output stage can be performed by the output DC rails variability. Higher significance of these measurements are seen when they are compared with the readings retained in the memory of the device from the manufacturing stage, allowing more accurate prognosis of the serviceability of the PSU.

Remaining in discussion of FIG. 8, in block 62 there are filtering components which provide attenuation bilaterally such that external spikes do not enter the PSU components causing damage, and also such that the internal switching noise is not emitted toward the input lines violating the conducted and radiated noise limits of EMC regulations. Contained in block 64 the principle circuitry provides a constant current PFC function with the unique addition that the PWM waveform is transmitted with fidelity to the processor block 72 such that the control processing can incorporate information related to both the AC phase, the AC detected load, and the AC detected current. Consistent with power factor correction the stage can be preceded by a capacitor 63 (C1) of value determining the Total Harmonic Distortion that is inflicted on incoming AC waveforms. This filtering effect changes the magnitude, but not the significance of the PFC output bulk capacitor 65 (C2) ripple, which still remains in phase with rectified mains haversine, and in the ripple magnitude is representative of output load within the constraints of PFC switch duty cycle.

It is known that the benefits of providing a power factor correction function is that the power supply device, irrespective of the load, maintains zero phase displacement between voltage and current waveforms of the incoming mains waveforms, such that over the reticulation network the power delivery capacity is maximised such that $VICosA$ is maximised where "A" represents the angle of displacement between the current (I) and voltage (V) waveform. It should be noted that whereas most PFC functions are provided for adapting alternating current (AC) to the output direct current (DC) voltage, it is known that DC waveform inputs are also valid inputs for conversion to different DC output voltages with no change of circuitry.

In the present embodiment, for the purpose of minimising the number of components required for overall function in pursuit of miniaturisation, the PFC function provides the only overall load regulation function of the entire device, where the output DC-DC stages operating on feed-forward ripple reduction in compensation of there being no overall load regulation, are able to provide high quality mains frequency reduction. The function of block 66 is restricted to simply "chopping" a 400V DC high voltage rail such that the transformer operation taking 400V DC to 24V DC can be performed. It is observed that PFC output ripple is preserved on the 24V DC output and used for purposes described herein in conjunction with the measurement of the PFC PWM duty cycle.

Firstly, the capacitance providing bulk output storage from the PFC function has a "ripple" determined by the load drain on the capacitance. This parameter can be expressed alternately as the depth of the "valley" when the full wave rectification waveform is increased as the load current increases and is considered in association with the PFC PWM duty cycle which is reflective of the input Vrms being 240V or 110V. This is suggestive that the power factor quality value increases as the load is increased. It can also be expected that under such circumstances, given appropriate and individual "calibration" which is retained in memory from manufacture due to the variance of the component values, and when such a processor has simultaneous measurement of the output power, on the individual rails adding to an output total, then a value representing the "efficiency" can be assessed and continuously monitored.

Secondly, the PFC bulk output capacitance ripple waveform expresses the input mains voltage allowing the registering of 110V AC mains or 240V AC mains operation which is determined by a longer time constant, say 10 mains cycles, monitoring of the PFC MOSFET PWM duty cycle and the output load in relation to the PFC output bulk storage capacitor ripple voltage.

Monitoring the PFC bulk output capacitance in association with the PFC PWM duty cycle importantly allows the detection of momentary inadequacies of the input power. Such "power quality" issues are of significant interest in many industrial settings where power reliability is not of a high quality allowing remote detection and reporting to provide diagnosis of malfunction.

Thirdly, maintaining phase information consequent to the tracking of valley voltages on the rectification filter capacitor allows determination of frequencies and missing cycles or voltage spikes which are out of character with the long term mains voltage. Such a waveform which has frequency distortion can be indicative of faulty or high resistance connections or that the input filtering is faulty.

All three virtues of monitoring the character of the input filter capacitor provide diagnostic information that relates to phenomena internal and external to the device. It may be observed that the pre-regulation waveform is also directly available from residual ripple on the 24V DC waveform on the secondary, simultaneously to the ripple varying PWM signal from the PFC controller which represents the instantaneous voltage at the input capacitance rectification filter. This information allows the determination of the correct operation of the PFC controller when the output power being delivered is known.

The operation of block 66 is to chop the for example, 400V DC+Vripple presented on the output PFC filter and storage capacitor. This function excludes any regulation function and is restricted to ensuring minimum heat dissipation is consequent to the use of a small planar transformer. The circuit employed to provide this function is referred to in the art as a half bridge circuit and to ensure zero voltage switching throughout the load range the transformer is generally required to have controlled primary inductance, controlled leakage inductance, controlled secondary inductance and specified coupling coefficient.

Block 68 represents the components performing synchronous rectification. In this section a MOSFET switch is in the conventional N-Channel IPAK in parallel to its body diode. The body diode has a forward voltage drop of, for example, 0.8V at 6 Amps, so dissipating 4.8 Watts. When the MOSFET is switched ON while the diode is forward biased and conducting current there is no switching noise generated and such current passes through an ON resistance of 0.010 Ohms, which means a forward voltage drop of only 0.060 Volts and a wattage loss of 360 mW, so saving about 4.44 Watts of heating. The timing is acquired from both the secondary windings and by an optical isolator connection to the primary side.

The secondary side synchronously rectified voltage output from block 68 is 24 Volts DC. This voltage is variable, but is chosen so that commonly found generator, battery or emergency 24V DC line voltages can replace the transformer output when incapable of operation because of inadequate 110V AC or 240V DC mains voltages. In these circumstances the power supply can operate under emergency conditions where the fall back oscillators emerge to supply clocks for the output rails buck conversion. During this "fallback" mode the primary side tests for adequate mains voltages and automatically restarts when the input supply mains are of adequate voltage and current capacity.

A reason for the selection of 24 Volts is that given the output voltage rails are usually 12V DC or less there exists a margin between 24 to 12 Volts which allows a period of fall within which a Power Fail Early Warning signal can be emitted if such a fall of the 24V DC is caused by disappearance of the input power. This period of "fall" or decay can be determined by the capacitance of the high voltage rectifier filter. During a period of mains input inadequacy the PFC controller completely drains the charge from the rectifier filter capacitor before the secondary 24V DC rail commences collapsing, thus providing a power fail warning. Extended Power Fail Warning (PFEW) can be provided by monitoring of the PWM signal value which exceeds limits of normal operation as the input rectifier filter capacitor voltage falls below normal operational level.

Blocks 70 represent buck modules whose input voltages are 24V DC and by conventional means provide a regulated DC voltage output. In FIG. 8 there are shown an example four such circuit sections, differing from each other in only two ways. Firstly, is a setting for the DC output voltage, and secondly is a relative timing of their switching which is originated from the synchronism of the main system timing, but each differently delayed in time. The benefit of this staggering of Buck converter operation is to create a time based disparity of radiated and conducted noise such that the frequency domain appearance determines that the frequency spectral lines are transferred to higher frequency, where they can be filtered by smaller components, and more importantly do not superpose in time so as to provide a magnified spectral line in the frequency domain.

A significant feature of the Buck converters represented by blocks 70 is that in this embodiment there exists three coincident points in the plane of the controller integrated circuit which represent attachable nodes to components in different and separate partitions. This allows the Buck converter function to be contained in a minimal or reduced volume with no reduction in power transfer capacity.

Block 72 represents a central supervisory function and communication functions of the device. A digital processor therein has access to numerous signals and is programmed such that sampling of such signals is done practically simultaneously for the purpose of establishing discrete states of operation so successive readings can establish the effects within the bandwidth of the significant signals and the appropriate sampling frequency strictures. Much significance is made of changes evolving from static installations which have been set up with temperature margins, current margins on each rail and noise margins. The processor block also provides a watchdog function, where the processor block emits a signal on the USB or comms line and monitors for a response. In the event of a nil response when one was expected the processor block initiates a re-start by dropping output rails and asserting low PWR_OK signal to the motherboard of the host system. Alternately the processor block can notify on a separate control network that the host is not responding. It is also possible that the power supply can instantiate diagnostic programs on the host motherboard such that comparison can be made against calibrated setup margins for comparison. Of great significance the substrate biasing currents of the multiple voltages are profiled at startup and shut down. These profiles represent the current vs voltage waveforms as the rails are brought up to operating voltage of a known configuration of peripherals dependent on the power supply.

Internal to the memory structure of the processor is a state space representation of the functioning device where all time based profiles and momentary readings are arranged in a structure. The system representation in this manner is consequent to the fact that at any time there is a distinct relationship between the variable values captured when the device is operating within operational limits. The processing has two major activities. The first activity is to monitor the functions of the device itself, and the second activity is to monitor the external environment. The first activity is required to qualify the integrity of the second activity in that a malfunctioning measurement system cannot be relied upon to communicate reliable information about the external environment.

In relation to the first activity of self monitoring, it has been described above that the device monitors the current drain from the input rectifier filter capacitor by monitoring the valley voltage, and it is shown in FIG. 8 that accurate current measurement is achieved by way of instrumentation amplifiers registering the momentary currents supplied on each DC voltage rail. This allows the calculation of a quality figure or value related to efficiency given due regard to the low frequency of the 100 Hz/120 Hz haversine waveform valley voltage in comparison to the say, 300 KHz sample rate of the supervisory processor. Between such 100 Hz-120 Hz epochs of valley-voltage is the say, 300 KHz power delivery cycle where the accurate calibration of the main transformer regulation curve as manifested on the 24V DC rail provides loaded and un-loaded voltage amplitude values with which to correlate these valley voltages. Given the mentioned access of the processor to this voltage measurement and the accurate timing available for sampling in relation to the start of each power delivery cycle, then the power taken through the transformer causes a momentary dip on the 24V DC rail in relation to other parts of the power cycle. The significance of this dip is calibrated easily under control test conditions at manufacture though the need for this calibration is lessened by the repeatable tolerances of the special transformer referred below. It is further calibrated if considered necessary to the demands of an application or even further available for calibration via remote communication which is provided via the Internet or USB connection to the dependant motherboard.

Furthermore, in regard to the first activity a setup process is provided such that current limits on each rail can be set up which are restricted to the be within the overall power delivery capacity of the product and with extension the time limits for over-current capacity. The device also measures the heat sink or thermo-electric connector partition temperature and monitors the progress of this temperature in relation to the power being delivered and the input supply voltage. The temperature profile for the 110V AC supply voltage, at say 80 W, is different to the temperature profile for a 240V AC supply providing the same load.

In general, self detection of asynchronous behaviour is contrary to the design and easily detectable by the processor. Of more subtle significance is the continuous measurement of signal variance. For example, the jitter detectable in the PWM waveform representing the average current driven through the input PFC inductor is significant as an indicator of pending failure given the time constant for control of PFC regulation is known and a consequence of the hardware design. Similarly, excessive noise on the output DC rails is indicative of failing modules and precedes complete failure, and the overall efficiency of the device as measured by itself is a further indicator of pending or extant failure to regulate. A knowledge database accumulated through testing and field experience provides increasing accuracy of self prognosis and self diagnosis, the latter useful during manufacturing and testing. The knowledge database can be provided as an internal or an external database for any given network.

Block 72 also enables monitoring of external devices and environments. As stated previously, the events related to the rectification filter capacity showing supply input voltage anomalies are represented to the processor in block 72 whereupon it is logged, assessed for significance and perhaps stimulates a transmission of some form. However, other parameters are also determined such as the environment temperature. If the efficiency is known at manufacture, then the temperature of the PSU device when operating at above ambient temperature can be used to reflect or predict surrounding air temperature. The fan current is also monitored for bearing noise.

Block 72 has a unique function in determination of degradation of the dependent system. The processor of block 72 can cause a diagnostic process to be run on the dependent system motherboard so providing an occasion where current profiles over time can be compared from a known and repeatable operation of the dependent system. This is particularly significant in maintaining a profile of start-up ramps for multivoltage motherboards. These start-up V-I profiles are sensitive signal indicators of semiconductor substrate crystal defects where change over time of such profiles indicate pending failure, and are also known in the art to change according to disadvantageous histories involving over-temperature operation in use or in manufacture.

It should also be noted that an embodiment of the device can provide an AC output for a variety of applications, for example by simply removing the output DC-DC stage and driving the AC out (e.g. 24Vac out) rather than rectifying the AC out.

Figure 9:
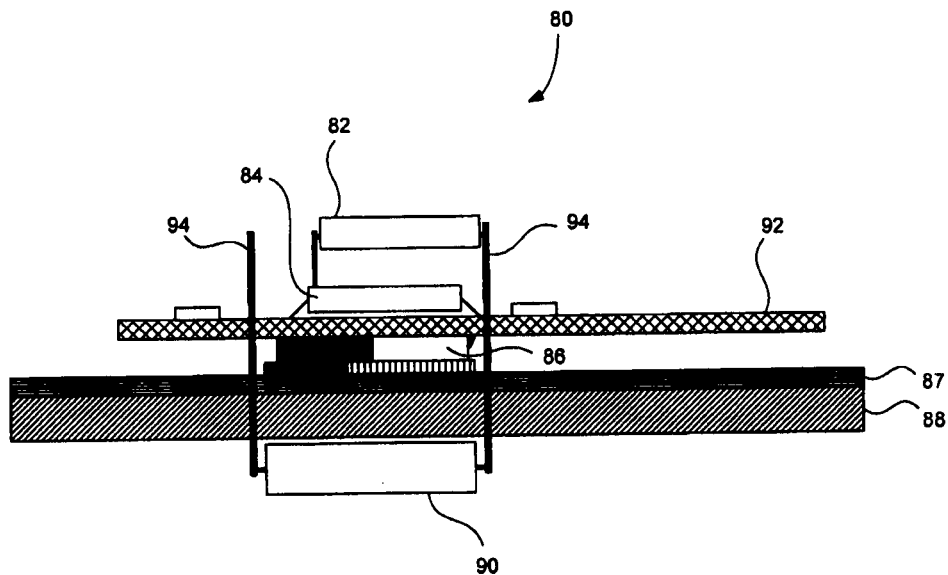
FIG. 9 illustrates a cross-sectional view of a further example layered structure for use in an example power supply device.

Referring to FIG. 9, there is illustrated an alternate representation of a physical layered structure 80 used in a power supply device. Capacitance layer 82 (i.e. capacitance partition) is positioned above and connected to control layer 84 (i.e. control partition). PCB laminate 92 supports control layer 84. Switch(es) 86, for example MOSFET switch(es), (i.e. power switching partition) are positioned adjacent silicon gasket or layer 87. The thermo-electric connector layer 88 (i.e. thermal conduction partition) operates as an electrical connector and heat-sink. Inductance layer 90 (i.e. magnetic partition) is positioned below thermo-electric connector layer 88, on the opposite side to the capacitance layer 82, control layer 84 and switch(es) 86. Through pins 94 are preferably moulded into thermally conductive material/plastic of thermo-electric connector layer 88 and connect required layers for operation. Circuit volume reduction is thus achieved by vertical stacking of components in layers or partitions.

Figure 10:
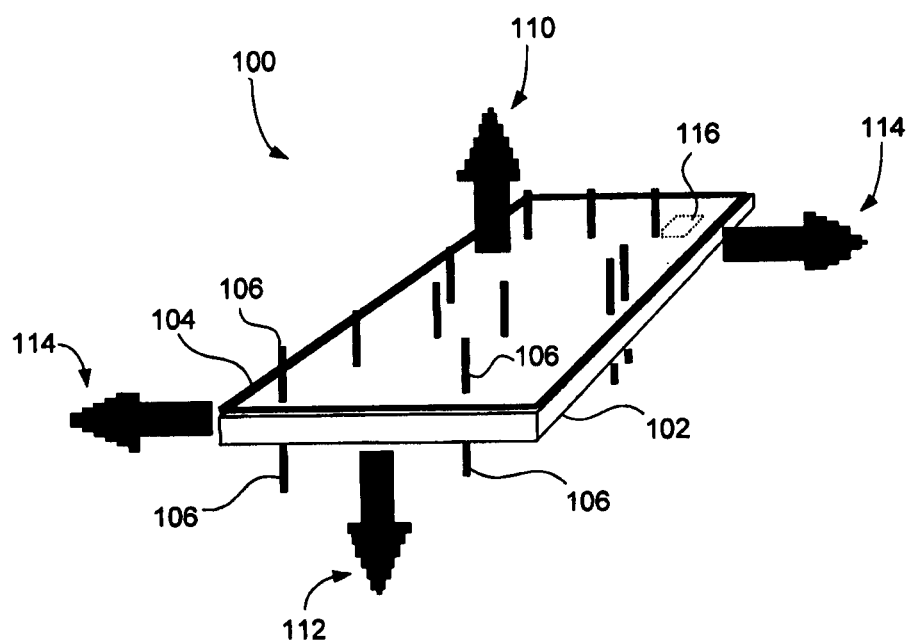
FIG. 10 illustrates a perspective view of a further example thermal conduction partition or layer for use in an example power supply device.

Referring to FIG. 10, there is illustrated a more detailed example of a thermal conduction partition or layer 100 which exists as an integrated component and could be referred to as a "thermo-electric connector". Thermal conduction partition 100 is thermally conductive and includes heat conductive layer 102, for example metallic or other materials, insulation layer 104, and through pins 106 can be fixed or moulded into position, thereby providing a function as both an electrical multiple pin connector and a thermal connector between partitions which in operation presents facets or sides such that heat is dissipated to other contact surfaces away from the electrically connective process toward surrounding heat-sink(s) or air flow.

Electrically conductive through pins 106, the number, length, width and arrangement of which can vary significantly depending on device design, are preferably moulded into or as part of the thermal conduction partition 100 for faster or improved assembly. Insulation layer 104 can be provided as a soft or compressible silicone gasket or layer to effect thermal contact with uneven or non-coplanar semiconductor switch thermal surfaces. The plastic moulding can be made of thermally conductive, electrically insulative plastic, such as polymer crystalline materials for example, and in addition to other plastic fillers optionally contains ferrite dust for electromagnetic shielding.

Arrow 110 indicates a surface of thermal connection to adjacent partitions, for example to thermal surfaces of MOSFET switches as components of the power switching partition 16. Arrow 112 indicates a surface of thermal connection to other adjacent partitions, for example to the magnetic partition 20. Arrows 114 indicate edge regions of thermal connection to surrounding housing or heat-sinks that are generally orthogonal to through pins 106 and surface planes of partition 100. Embedded temperature monitor 116 can be provided and thermally glued into a recess in the Thermo-Electric moulding.

Hence, in one example a thermal interface or surface of the thermal conduction partition is substantially planar. In another example the thermal interface or surface is a soft or compressible material, for example silicon rubber. In another example the thermal interface or surface is profiled allowing for different component heights in a partition or layer adjacent or near the thermal conduction partition, for example the power switching partition. This can also be used to provide for strategic or selective shielding on the power switching partition.

The surface of the thermal conduction partition can be profiled, for example when injection moulded, to accommodate any surface changes or irregularities for good thermal connection with other components, such as the switch interfaces on the power switching partition. Another motivation for profiling could arise from placing "fins" in the tubular airflow whilst accommodating the ferrites below, so as to introduce more surface area of the heatsink into the airflow, while not reducing the airflow to offset such an advantage. Also, a larger area of thermal connectivity with the metallic walls of the encasement could be achieved. Furthermore, a profiled surface can provide wells suited to accommodate "thermal grease", in which case a silicon rubber layer is not used. Suitable wells or nacelles can be filled with thermal grease (i.e. a thermal gel, compound or paste), which is a heat transfer material that is solid at room temperature but turns to a viscous material at elevated temperatures.

In one embodiment, modern MOSFET switching devices can be used which have a specially constructed surface providing improved heat dissipation. The heat dissipating surface of the MOSFET switching device can be placed in a plane parallel to the thermal conduction partition and is suitable for very good thermal contact with the thermal conduction partition. For example, a CanPAK™ package sold by Infineon Technologies AG can be utilised in the power switching partition as a package with a very low thermal resistance to the top and bottom sides of the package, which can assist in heat transfer from components of the power switching partition to the thermal conduction partition.

In various non-limiting forms there can be provided the following features and/or advantages.

Partitions are provided and intended to enhance isolation of the magnetic circuitry from the electrical, and both from the control circuitry. This partitioning design achieves smaller overall size dimensions within which relatively high currents and relatively dense magnetic fields may be employed without interference of a control function. Such partitions can provide a structural function and also serve a purpose of heat dissipation providing heat transfer pathways to surrounding power supply encasement.

A thermally conductive and compressible material can be used as a sheet representing a single plane common to power switching device thermal surfaces, so providing a single thermal interface between power semiconductor switching components and the thermal conduction layer, which is detachable and secured by a fastener, such as a screw or other alignment component, so providing mechanical fixation and thermal dissipation.

A function of supplying an extended period of power fail warning can be provided, in contrast to a known PSU of similar size, such that a processing unit being supplied with power can take precautionary steps to minimise undesirable effects of the power supply being involuntarily shut down. This is primarily a function of the provision of additional protected space for capacitors.

There is provided an ability to thermally connect higher energy components such as MOSFET drivers on a control partition to surrounding heat-sinks, so as to minimise hot spots which could otherwise reduce expected reliability. This thermal connection can be enhanced by layers of silicone or other thermally conductive compressible material pressed against the thermal relief solder filled holes under heat sink pads on a PCB, again allowing a single plane interface between a heat sink platen and active switching semiconductor.

The enclosure can be used to thermally connect to outside enclosures which can extend the ability to distribute heat, such that a lower overall temperature rise can be achieved, being related to more than one side of the enclosure being effectively in thermal connection with the internal semiconductor and magnetic conduction parts. There is the ability to accommodate various entry positions for a Mains Alternating Current power inlet connector being attached to any of the sides in the available space.

There is the ability to place different type components in closer proximity. Such an example is the placement of MOSFET switching devices in relatively close proximity to the controller or driver semiconductor so as to minimise a current loop of a drive pulse for each of the required number of switches.

Reduction of lead lengths between magnetic components and high current switching devices provides advantageous proximity, thus reducing leakage inductance and smaller current loops, so minimising parasitic effects such as overshoot and electromagnetic radiation and conducted noise. The reduced connection length is effected by the through pins providing an electrical interconnect between partitions.

The partitioning allows reduction of switching noise such that accurate current readings can be taken of currents being consumed by dependent electronics, such that digital settings can be programmable of current limits. Such programmability allows the current to be provided to the dependent electronics in the quantity required at individual voltage rails within the overall power capacity of the device. This avoids the use of an overrated power supply to meet the minimum requirement of a single rail, but which may be vastly overrated on other voltage rails.

The partitioning also allows reduction of switching noise such that accurate current readings can be taken of currents being consumed by dependent electronics, such that small changes can be detected in the current being consumed for calibrated tasks undertaken by the dependent electronics, to the end that the degradation of the dependent electronics can be assessed allowing remote monitoring by way of a LAN or WAN connection to predict the possibility of system failure.

The partitioning also allows a layering effect providing a unique facility for testing in a computer controlled test environment. For example, the magnetic partition layer can be made a permanent part of a test fixture such that surface mounted PCBs are passed across this test fixture and pressed into pinned attachment with the known functional magnetic partition for short periods of time adequate to complete a functional test. In this arrangement of vertical disposition, the auto-test pins of the computer controlled test fixture replace the through pins of the thermo-electric connector previously described. Similarly, regulation control and power switching control can be connected to the auto-test interface which contains the actual power switching devices and further contains the magnetic partition, thus allowing PCB regulation and switching control to be tested in a known environment. The exploitation of this layering structure allows improved or better use of robotic or computer aided manufacture technology and reduced or minimal use of labour. Consequentially, this test and manufacture process provides for a lower cost of production.

The partitioning and reduction in size can also provide the ability to mount the PSU in thermal connection to dependent heat dissipative elements to which the PSU supplies power. For example, in a conventional PC the present PSU can be mounted on the CPU and/or other associated exothermal semiconductor devices, so as to perform both a power supply function and a heat dissipative function. For greater heat dissipation the multi-sided heat transfer capacity of the PSU allows thermal connection between a CPU and further heat dissipation surfaces. Such a design allows a commensurate reduction in the volume required for a PC encasement and generally advantageous thermal levelling in embedded systems.

The partitioning also provides the ability of using the through pins to pass into the circuitry of the dependent electronics consuming the power output of the PSU. In addition to minimising line lengths such an arrangement of connections dispenses with inelegant wiring looms. The generally vertical disposition of the layered partitions provides a significant benefit for high current low voltage CPU cores which operate at a high frequency.

The partitioning into layers can separate layers including various components, for example a layer of ferrite, a layer of power semiconductor, and a layer of PCB based control integrated semiconductor. Layers can be made of specific materials, such as ferrite doped thermoplastics on the magnetic layer having embedded windings of FPCB which mate with through pins to the power switching layer and also to the PCB control and capacitance layers. Alternate to this the ferrite components, such as E cores, can be embedded in the moulding similarly to the through pins allowing subsequent autoplacement of winding coils. Such an organisation of materials facilitates the design and manufacture of integrated magnetics achieving advantages of efficiency, reduced noise and ease of manufacture. Similarly, integration of the power switching layer by thick or thin film fabrication can be performed providing advantages of thermal dissipation and even smaller current loops, lower noise and lower EMC.

The embodiment described herein significantly reduces the space or volume required for a power supply unit or device. This can also be used to reduce the space or volume required for overall encasement of PC motherboards and peripherals, or other electronic components. Example advantageous features or uses can include:

1. Providing the required spacing to achieve compliance with regulatory strictures of creepage and insulation thickness by arranging insulation placed in a vertical arrangement of connected parts.

2. Providing spatial separation so reducing the coupling of fast switching physical objects to earths and other susceptible circuitry.

3. Providing an encasement with improved safety compared to an "open frame" device which has high voltage elements accessible by fingers of the assemblers.

4. Providing an encasement allowing thermal connection to two or more outer PC case walls, simultaneously.

5. Providing an encasement in which extension of the through pins to the outside of the case provides a short pathway to a PCB, such as a motherboard with a heat producing CPU. The through pins are thus connections to a further vertically disposed load layer.

6. Providing an encasement which can be itself used as a heat-sink for other devices such as a CPU which requires thermal relief. Such an application by replacing the bulky heat-sinks on PC motherboards incurs only, for example, about a 15% penalty in heat generated in the same space as the original heat-sink, while saving the bulk volume of a PSU mounted elsewhere.

7. Providing a smaller volume of PSU able to fit smaller volumes and lower cost PC cases, using, where appropriate, the small case itself to assist heat dissipation.

8. Providing a means of channelling heat from smaller driver elements on the controller PCB surface partition down to the heat sinking function of the base platen so reducing "hot spots" or over-temperature devices among the controlling electronics.

9. Providing more space for the use of energy storage devices to achieve improved hold time when a power grid misses cycles, and also providing an increased warning period when power input from mains is lost allowing a managed shutdown.

Transformer

In an alternate non-limiting embodiment there is provided a transformer, which is now described. In one example aspect, the transformer can be used as a component part of the power supply device. However, it should be appreciated that the example transformer can be generally used as a transformer in a wide variety of other contexts or electronic circuits.

Figure 11:
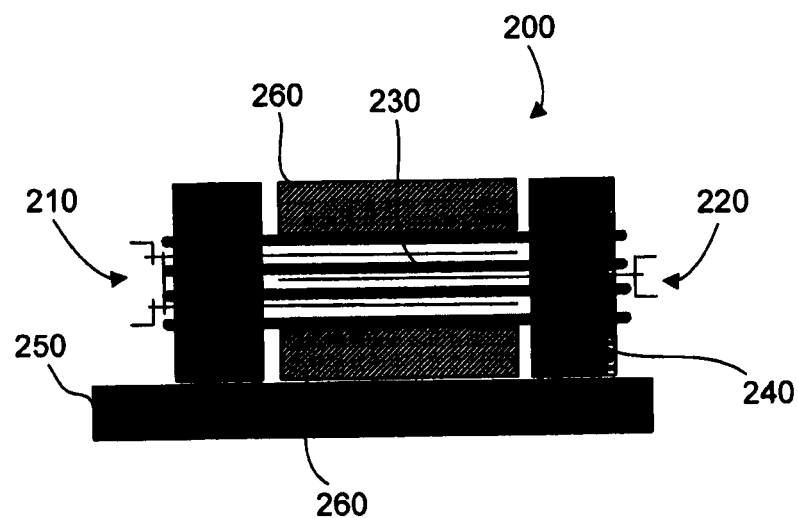
FIG. 11 illustrates a cross-sectional view of an example transformer.

Referring to FIG. 11 there is shown a cross-sectional view of an example transformer 200 that can, in one form, be generally described as a "rubber transformer". Transformer 200 includes primary winding linked coils 210 and secondary winding coil 220. In various examples, any number of one or more primary coils 210 or secondary coils 220 could be used as necessary. Inter coil separators 230 are provided between primary coils 210 and secondary coil 220, in one example inter coil separators 230 are made of thermally conductive and compressible silicone rubber. Heat dispersal block 240, for example is also made of silicon rubber which thermally connects or integrates with inter coil separators 230 for providing thermal transfer. Heat sink 250 can be a variety of materials, again for example silicon rubber.

Thus, inter coil separators 230 and heat dispersal block 240 at least partially cover or are placed about winding coils 210, 220. Magnetic core 260 can be made of a variety of ferrous materials. Coils 210, 220 can be fabricated from, for example, double sided flexible and thin laminate, such as copper foil PCB with a Polyimide central sheet or core and cover layers insulating both sides of the copper foil. In one form this laminate can be 0.15 mm thin for 35 μm thickness copper conductor. The heat dispersal block 240 is preferably coupled to inter winding separators 230. Winding coils 210, 220 of separate voltage can be separated by separators 230 formed as silicone rubber sheet, or other similar material, which is typically 0.5 mm in thickness.

Figure 12:
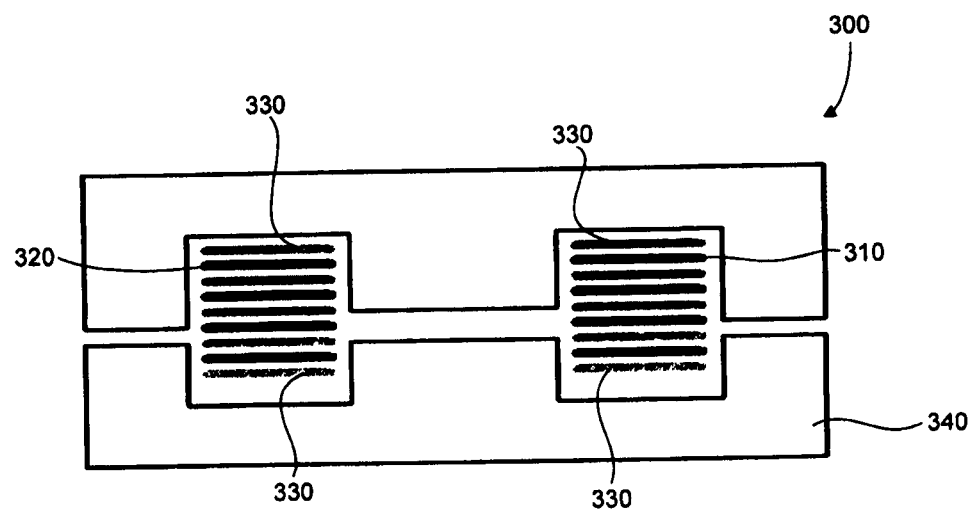
FIG. 12 illustrates a side view of a further example transformer.

Referring to FIG. 12 there is shown a side view of a further example transformer 300 provided with primary linked coils 310 and secondary linked coils 320. Primary auxiliary windings and secondary auxiliary windings can also be provided. Inter coil separators and heat dispersal block is generally shown as components 330, for example made of silicone rubber, an example material that can be used which has high temperature electrical insulator performance and heat conduction properties. Core 340 is a magnetic material. The extent of the silicone rubber 330 overhangs the end windings of the winding coil laminates and so is able to thermally connect or couple between winding coils and establish a thermal pathway to a heat sink.

Figure 13:
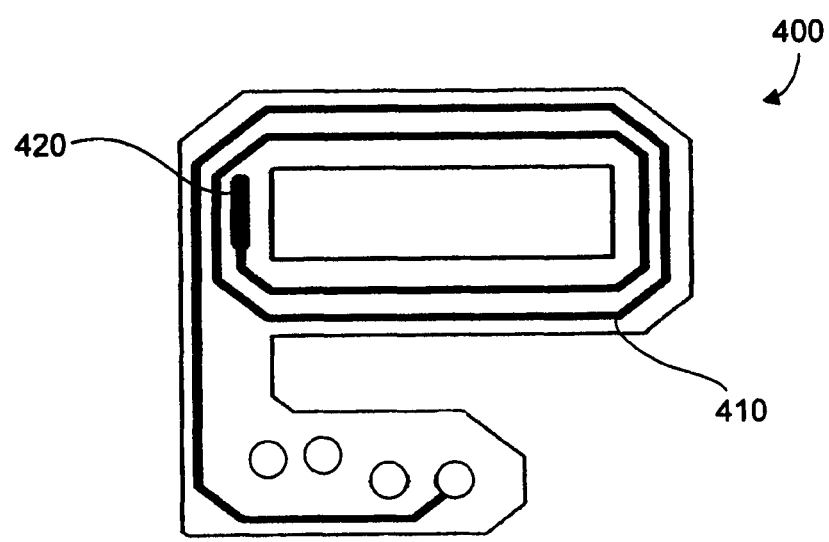
FIG. 13 illustrates a top view of an example single coil laminate for use in an example transformer.

Referring to FIG. 13 there is shown a top view of an example single coil laminate 400 for use in transformer 300. Laminate 400 can be made of, for example, polyimide covered conductive metal 410, such as copper strips. Laminate 400 has top and bottom cover layers 420 and a typical thickness of about 0.22 mm. Alignment holes are shown suitable for use with "pick and place" automatic insertion machinery.

In one aspect, there is provided an arrangement of magnetic (e.g. ferrite) materials and a plurality of relatively thin laminate winding coils and compressible insulator components coupled with a magnetic circuit which provides a transformer. The winding coils are thinner than the coil separators placed between the winding coils. This allows the number of winding coils to be increased or decreased as required.

The compressible insulator components (i.e. coil separators and heat dispersal block) are arranged such that heat can be transferred from inter-coil spaces to heat sinks mounted above and/or below the transformer.

The combination and/or number of primary and/or secondary, winding coil laminates may be changed to alter the turn ratio between primary and secondary circuits. This is possible as the coil winding laminates are suitably thin and the separators are sufficiently compressible.

The subject transformer can be made to supply multiple or singular output voltage rails of various power ratings to computational or other electronic equipment, while being itself supplied by AC voltages of a high frequency, typical of switch mode power supplies. In one form, the transformer uses Flexible Printed Circuits Boards (FPCB) which are produced by pressure knife stamp tooling forming the outlines of thin flexible printed circuit coils or windings. This provides a high degree of repeatable accuracy of shape and size in such thin FPCB laminates.

It is known that a high voltage and high frequency waveform applied at the primary power input side of a currently known so-called planar transformer presents an inhibition to widespread use of so-called planar transformers. This relates to the undesirable capacitive coupling of energy to the secondary coils or windings because of the close proximity of the characteristic thin but large surface area conductor foils. For high voltage inputs this capacitive coupling of a high voltage, high slew rate and high frequency negatively offsets the advantage of using thin conductors which present lower impedance loss due to the "skin effect".

In one form of the subject transformer, close proximity of coils causing capacitive energy transfer has been alleviated by the employment of the high dielectric strength, relatively thick but compressible, separator placed between the relatively thin coils of the primary and secondary circuits. Thus preserving the advantage of the lower impedance due to the skin effect and minimising capacitive coupling while controlling magnetic coupling. The separator, for example made of silicone rubber, can be selected from different dimensions suitable for different voltages and currents desired to be input and output from the transformer in relation to the size of the "window" area of various ferrite magnetic circuits.

Silicone rubber provides a significant benefit of good heat conduction and transfers heat. This reduces the temperature internal to the stacked windings in the magnetic (e.g. ferrite) core. In turn, this allows greater currents to be carried by the windings so allowing higher power density in the transformer. Thermal transfer also allows a more uniform temperature throughout the transformer, avoiding winding "hot spots" caused by non-uniform conductance in the winding conductors.

In various non-limiting forms there can be provided the following features and/or advantages.

The transformer provides an advantage of modularity, and has thin winding coils, for example laminar in nature, which are arranged in a compressible rubber framework. Without substantially changing stack height, the addition of winding coils to achieve serial or parallel combination of the winding coils allows the creation of a wide variety of different functioning transformers from a limited number of coils. It is a further advantage that such coils are able to be inter-digitated such that a high degree of inter-winding coupling can be achieved. This allows self commutated synchronous rectification as well as minimisation of primary-secondary capacitance.

In one example, laminated winding coil sections may have thicknesses of about 0.20 mm, so that in a typical core window of about 5.0 mm height, it is possible for about 25 such coils to be used without separator insulation. However, a typical application might use about 7 winding coils and about 7 thermally conductive separators (e.g. silicone rubber layers) providing an overall thickness of about 4.9 mm. Common with other PCB foil laminate conductors there is a significant advantage in reducing skin effect resistance given the surface area increase in relation to the conductor cross section area, and given the advantage of being able to increase the number of conductors this advantage is further enhanced.

The use of compressible separators as mechanical partitions may offer about a 30% compressibility of the winding stack, such that the addition of further winding coils, for example another one or two 0.2 mm coil laminates in the above example, can be achieved without difficulty. Further winding coils may require a larger window area of the ferrite core, depending on the inter-winding capacitance required to be minimised as determined by separation.

Furthermore, the use of compressible separators as mechanical partitions serves a purpose of minimising inter-winding capacitance which allows use of the transformer in relatively high primary voltage applications. Such typical inter-winding capacitances with one such separation layer between all windings of an example 7 coil inter-digitated winding are of the order of 30-40 pF and such low capacitance coupling minimises common mode noise injected into a typical isolated secondary circuit.

Furthermore, the use of compressible separators, for example silicon rubber, as mechanical partitions serves a purpose of heat dissipation and provides heat transfer pathways to the surrounding encasement. Thin winding coil laminates may be used in parallel to achieve double the original current density, thus reducing heat or increasing the desired coil current limit or both.

The addition of extra winding coils (such as laminates) into the winding coil stack, when in parallel, can achieve greater inter-winding coupling where the primary or secondary coils can be inter-digitated between an added coil and an associated parallel added coil.

The addition or subtraction of winding coils on the primary side, so increasing or decreasing the number of primary turns, allows the determination of input primary inductance independent of management of magnetic path flux impedance (or MMF). The management of MMF by the creation of gaps, and thus control of saturation, is a determinant of the regulation properties of the transformer. The determination of primary inductance is also a primary requirement in the topology of resonant primary circuits and the reduction of circulating currents is an important consideration for high efficiency.

The transformer may or may not have cover-layers for additional insulation properties, and a higher inter-winding isolation than conventional wire wound transformers of similar overall size can be provided. Such isolation is typically 20 kV for a two PI and one silicon rubber inter-winding boundary. If a Polyimide cover-layer is used the insulation has an electrical breakdown temperature much in excess of wire wound coils. For example, such a temperature is of the order of 350° C.

Different turns ratios can be provided by adding or subtracting coil laminates. Primary winding impressed voltage slew rates can be controlled by control of the primary inductance by adding or subtracting winding coils (e.g. in laminate form) so as to achieve compliance with EMC emissions limits. Also, consequent on the slew rate limitation is the reduction of high frequency components of sharper rise and fall times that cause heat dissipation within the magnetic core. It is well known that core loss is proportional to the square of frequency so lower slew rates for any intended frequency of operation reduces unwanted heat production in the ferrite core of the transformer.

The magnetic ferrite can be overlaid with winding coil layers and the separator layers to achieve a fast assembly process. This assembly process can be performed by auto-placement SMT robots or pick and place SMT machinery.

The dielectric absorption effects of silicone rubber serve to reduce ringing of the waveforms and consequently improved damping of the frequencies of flux disturbance in the ferrite core. It is known that the higher the frequency the greater the heat production of the coupled ferrite core.

The thin coil laminates can be placed in relatively high resolution in respect of the ferrite gap or window, thus determining differential leakage inductance in separate primary coils which determines the ability of certain specific power converter topologies to effect the phenomenon known as "ripple steering". This is where input ripple current, deleterious to EMC compliance, can be directed between primary windings and secondary to have a null ripple at the input. Topologies such as SEPIC (Single Ended Primary Inductance Converters) can be used to convert low distortion mains current waveforms (high power factor) into lower voltage driven high current secondary circuits with minimal parts.

Optional embodiments of the present invention may also be said to broadly consist in the parts, elements and features referred to or indicated herein, individually or collectively, in any or all combinations of two or more of the parts, elements or features, and wherein specific integers are mentioned herein which have known equivalents in the art to which the invention relates, such known equivalents are deemed to be incorporated herein as if individually set forth.

Although preferred embodiments have been described in detail, it should be understood that many modifications, changes, substitutions or alterations will be apparent to those skilled in the art without departing from the scope of the present invention.

The invention claimed is:

1. A thermal/electrical connector comprising
a thermally conductive layer with integral electrical pins, wherein the thermally conductive layer is disposed between two layers of electronic components, and wherein the integral electrical pins are configured to provide electrical connections between electronic components on each side of the thermally conductive layer;
wherein the thermally conductive layer is in thermal contact with heat-generating components in at least one of the layers of electronic components,
wherein the thermally conductive layer is configured to conduct heat from the heat-generating components to edges of the thermally conductive layer, and
wherein substantially all of the heat from the heat-generating components is dissipated through the edges of the thermally conductive layer.

2. The thermal/electrical connector of claim 1, wherein the thermally conductive layer is compressible or profiled such that the thermally conductive layer makes good thermal contact with power semiconductor components of different heights.

3. The thermal/electrical connector of claim 1, wherein the integral electrical pins are moulded as part of the thermal/electrical connector.

4. The thermal/electrical connector of claim 1, wherein the thermal/electrical connector magnetically isolates one of the two layers from the other.

5. The thermal/electrical connector of claim 1, further comprising an electrically conductive layer.

6. The thermal/electrical connector of claim 1, further comprising a layer comprising ferrite or ferrous material.

7. The thermal/electrical connector of claim 1, further comprising an electrically insulating layer.

8. A power supply comprising
a capacitance partition comprising a capacitive electrical energy storage component;
a power switching partition comprising a power semiconductor component, the power switching partition disposed below the capacitance partition;
a thermal conduction partition comprising the thermal/electrical connector of claim 1, wherein the thermal conduction partition is disposed adjacent to the power switching partition, and wherein the heat-generating components comprise the power semiconductor component; and
a magnetic partition comprising a transformer or inductor, the magnetic partition disposed adjacent to the thermal conduction partition;
wherein each partition comprises a layer of components, and wherein most of the components in each partition provide a similar function.

9. The power supply of claim 8, further comprising a control partition disposed between the capacitance partition and the power switching partition, the control partition comprising digital logic.

10. The power supply of claim 8, further comprising a thermally dissipative encasement housing surrounding the partitions and in good thermal contact with the thermally conductive layer.

11. The power supply of claim 8, wherein the thermally conductive layer is shaped with wells matched to components of different heights on the power switching partition, and wherein the wells are filled with a thermal gel, compound, or paste.

12. The power supply of claim 8, wherein the thermal conduction partition is configured to maintain the capacitance partition at a cooler temperature than the magnetic partition when the heat-generating components are generating heat.

13. The power supply of claim 9, wherein the control partition is configured to monitor serviceability of the power supply.

14. The power supply of claim 13, wherein the serviceability comprises power conversion efficiency, power conversion noise, and temperature.

15. The power supply of claim 13, wherein the control partition is connected to a network, and wherein the control partition is configured to transmit the serviceability of the power supply over the network.

16. A method of manufacturing a power supply comprising:
   providing a thermal conduction partition comprising a thermally conductive layer with integral electrical pins configured to provide electrical connections between electronic components on each side of the thermally conductive layer;
   using automatic placement equipment to position a magnetic partition adjacent to and on a first side of the thermal conduction partition, the magnetic partition comprising a transformer or inductor;
   using automatic placement equipment to position a capacitance partition on a second side of the thermal conduction partition, the capacitance partition comprising a capacitive electrical storage component;
   using automatic placement equipment to position a power switching partition adjacent to the thermal conduction partition such that the thermally conductive layer is in thermal contact with components in the power switching partition, the power switching partition comprising a power semiconductor component; and
   using automatic placement equipment to position a control partition adjacent to the capacitance partition, the control partition comprising digital logic;
   wherein each partition comprises a layer of components, and wherein most of the components in each partition provide a similar function.

17. The method of claim 16, further comprising using automated test equipment (ATE) to test at least one partition during the manufacturing.

18. The method of claim 17, wherein the testing is performed after the partition to be tested is positioned and before the next partition is positioned.

19. The method of claim 17, wherein the ATE simulates the function of components and partitions not yet positioned.

20. The method of claim 17, wherein the ATE measures serviceability of installed components and partitions.

* * * * *